United States Patent
Lovelady et al.

(10) Patent No.: US 10,025,189 B2
(45) Date of Patent: Jul. 17, 2018

(54) LITHOGRAPHY PROCESS FOR THE ENCAPSULATION OF PATTERNED THIN FILM COATINGS

(71) Applicant: PIXELTEQ, INC., Largo, FL (US)

(72) Inventors: Heather Lovelady, Largo, FL (US); Ronnie Varghese, Palm Harbor, FL (US)

(73) Assignee: Ocean Optics, Inc., Largo, FL (US)

( * ) Notice: Subject to any disclaimer, the term of this patent is extended or adjusted under 35 U.S.C. 154(b) by 0 days.

(21) Appl. No.: 15/210,992

(22) Filed: Jul. 15, 2016

(65) Prior Publication Data

US 2017/0018428 A1     Jan. 19, 2017

Related U.S. Application Data

(60) Provisional application No. 62/193,174, filed on Jul. 16, 2015.

(51) Int. Cl.
| | | |
|---|---|---|
| H01L 21/3105 | (2006.01) | |
| G03F 7/16 | (2006.01) | |
| H01L 21/027 | (2006.01) | |

(52) U.S. Cl.
CPC .......... *G03F 7/168* (2013.01); *H01L 21/0272* (2013.01)

(58) Field of Classification Search
USPC .......................................... 430/329
See application file for complete search history.

(56) References Cited

U.S. PATENT DOCUMENTS

| | | | | |
|---|---|---|---|---|
| 4,202,914 A | * | 5/1980 | Havas | H01L 21/0272 204/192.26 |
| 2006/0154412 A1 | * | 7/2006 | Brodsky | H01L 21/0273 438/197 |

* cited by examiner

*Primary Examiner* — Daborah Chacko-Davis
(74) *Attorney, Agent, or Firm* — Dennis L. Cook, Esq.

(57) ABSTRACT

A single lithography process for multi-layer metal/dielectric coatings using a series of developing, baking, and lifting steps to coat two or more thin films without re-patterning that results in the encapsulation and profile optimization of multi-spectral patterned thin film coatings is disclosed.

1 Claim, 4 Drawing Sheets

LITHOGRAPHY PROCESS FOR THE ENCAPSULATION OF PATTERNED THIN FILM COATINGS

CROSS-REFERENCE TO RELATED APPLICATION

The present application claims the benefit of previously filed co-pending Provisional Patent Application, Ser. No. 62/193,174, filed Jul. 16, 2015.

FIELD OF THE INVENTION

This invention belongs to the field of thin film dielectric-metal coatings. More specifically it is a process using a series of developing, baking, and lifting steps to coat two or more thin films without re-patterning.

BACKGROUND OF THE INVENTION

Several prior art methods of depositing and protecting dielectric-metal coatings are known such as the method described in U.S. Pat. No. 7,648,808 issued to Buchsbaum, et al., which deals with a final blanket coat deposited on top of patterned features. In the Buchsbaum disclosed method, features are patterned and deposited using a lift off process followed by a novel final blanket coating step that completes the coating stack and results in passivation of the metal layer edges. The passivation of the metal layer edges prevents oxidation and corrosion of the metal. The final blanket layer can be a group of layers such as a final cavity mirror or anti reflection layers or a single layer of a material. These layers may use materials specifically selected for their corrosion resistant properties. This prior art technique is compatible with partially or fully populated patterned areas but utilizes a continuous blanket coating over the coated and uncoated patterned regions. It is not compatible with wafers with bond pads or similar uncoated area requirements. Prior art described in Patent No. EP2746739 A2 describes methods of depositing dielectric-metal coatings by which the metal in these coatings have to be encapsulated by the dielectric. It is apparent to those skilled in the art that such encapsulation requires dual layer patterning like in U.S. Pat. No. 5,120,622 or deposition at special angles, Patent No. EP2746739 A2. U.S. Pat. Nos. 5,711,889, 6,638,668, and 7,648,808 issued to Buchsbaum disclose a method wherein the features are patterned and deposited using a lift-off process which utilizes an undercut. Another prior art method presently used in the industry is a dual layer patterning process that utilizes a non-photosensitive base layer under a photo sensitive resist layer (see FIG. 1 top). As shown in the bottom of FIG. 1, subsequent thermal processing can lessen or eliminate this undercut. On heating, the top layer of photoresist reflows and pulls back from the edge leading to a reduced lift-off profile. It is herein disclosed that adding a post-bake development step will aid in the lift-off process by re-creating the undercut. Thus, after the resist reflows, the substrate can be developed again to remove some of the non-photosensitive base layer. Since the photoresist has been exposed and baked, it will not be affected by the extra develop. This post-bake develop has also been imaged by SEM (See FIG. 2). These SEM images show that a second develop can be employed to re-create the undercut. In applications requiring encapsulation of a first deposited film by a second deposited film, the photoresist profile has to be sloped to permit the second deposited film to effectively encapsulate the first film. The invention of this disclosure provides the line of sight for the encapsulation whilst still maintaining the undercut in the liftoff profile (See FIG. 3).

By using the lithography process disclosed in this application the prior art's limitations described above can now be overcome.

BRIEF SUMMARY OF THE INVENTION

The invention of this disclosure is a single lithography process for multi-layer metal/dielectric coatings using a series of developing, baking, and lifting steps to coat two or more thin films without re-patterning that results in the encapsulation and profile optimization of multi-spectral patterned thin film coatings.

BRIEF DESCRIPTION OF THE DRAWINGS

For a fuller understanding of the nature and objects of the invention, reference should be made to the following detailed description, taken in connection with the accompanying drawings, in which.

DESCRIPTION OF THE PREFERRED EMBODIMENT

The preferred embodiment of this method discloses that by using a double develop, taking advantage of the reflow characteristics of the photoresist, and a dry lift-off process one can coat an encapsulating layer without having to re-pattern the substrate. Details of each step in the proposed processing method are disclosed below.

Figure 1:
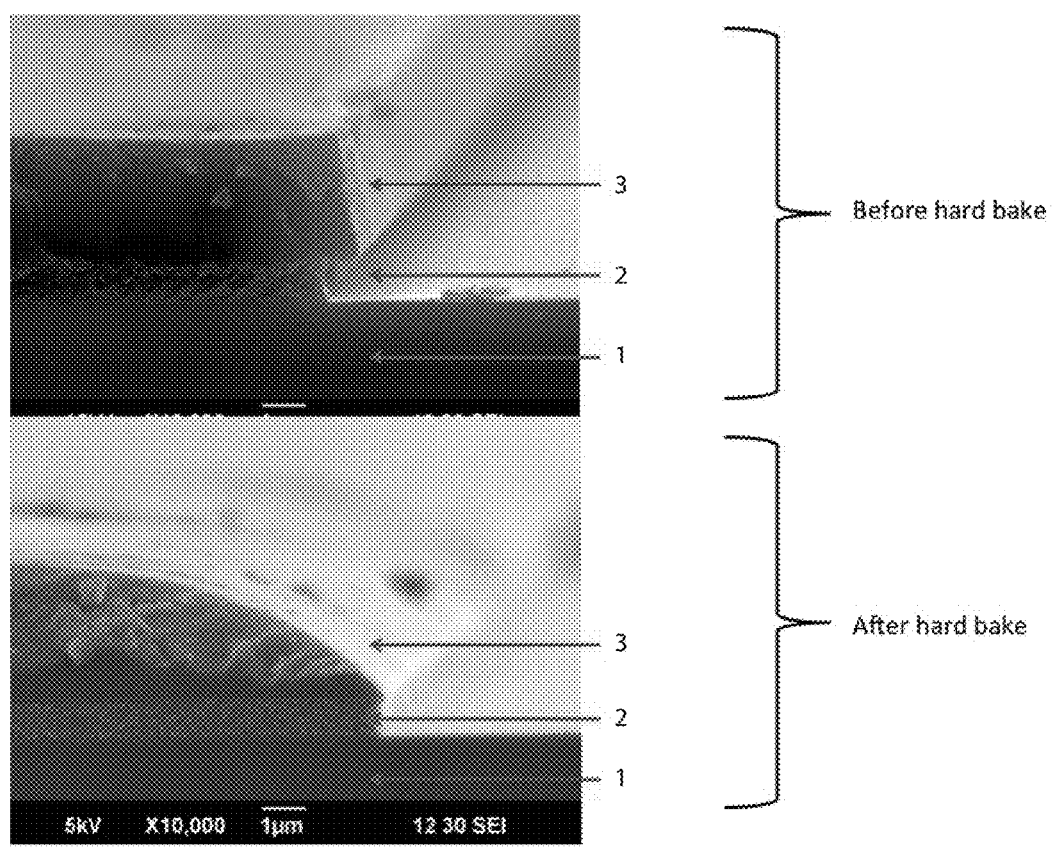
FIG. 1 is a SEM photograph showing the effects of baking on undercuts.
Figure 2:
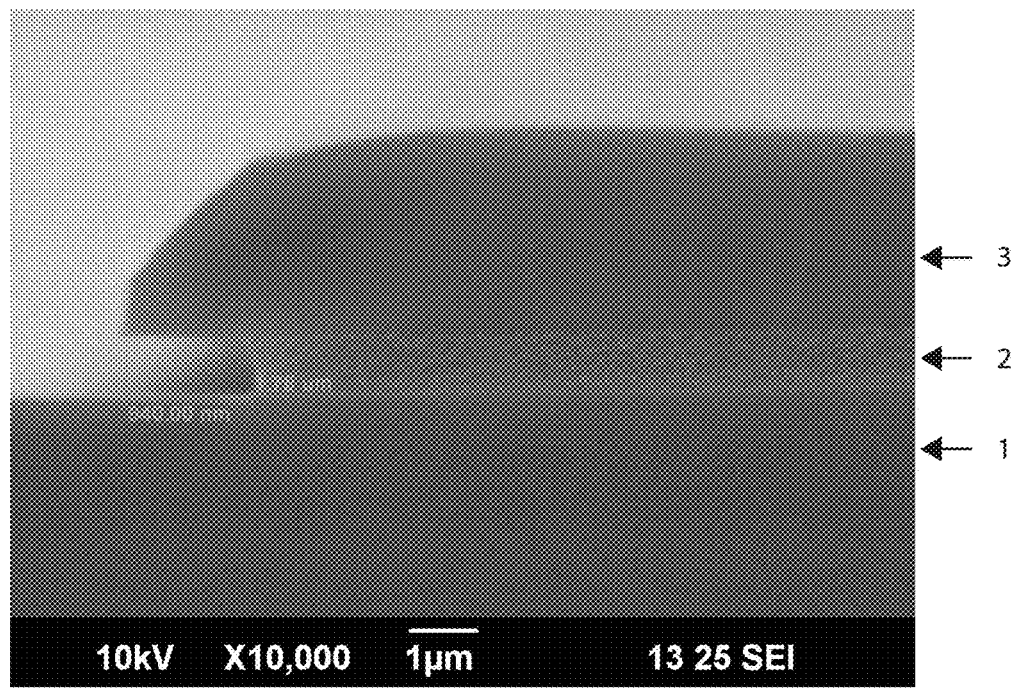
FIG. 2 is a SEM photograph showing the effects of the extra develop step.
Figure 3:
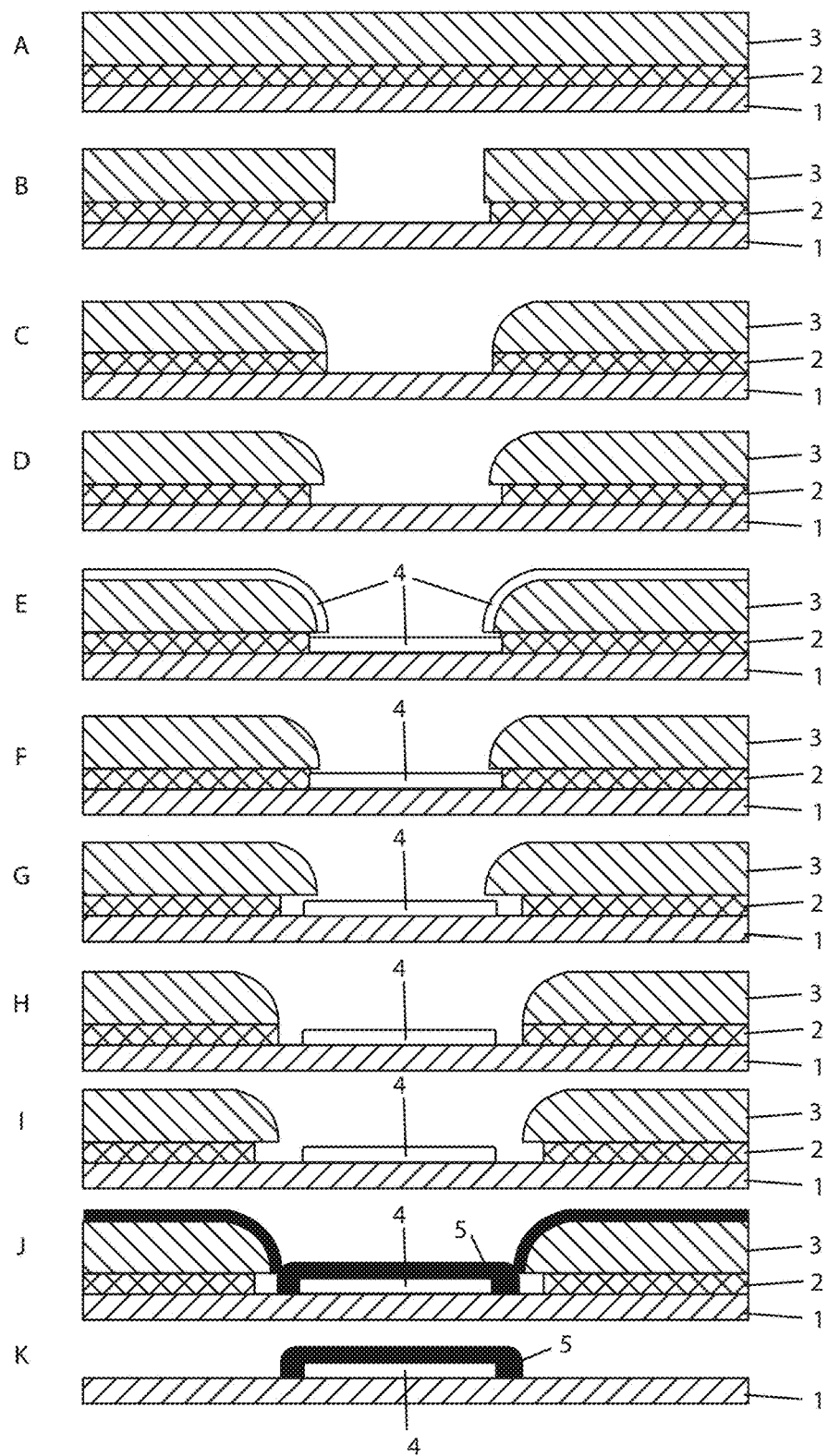
FIG. 3 is a diagram showing of the steps of the preferred embodiment of this disclosure; and, FIG. 4 is a diagram showing the effects of the photoresist profiles on the transition zone of the deposited film.

The steps of this lithography process as shown in FIG. 3 are as follows:

In step A, the substrate (1) is spun with two layers of resist; a non-photosensitive base layer (2) (that creates the undercut during development), and the photoresist (3) on top, resulting in a wafer (1,2,3). The photomasks (not shown) need to be designed to take into account the widening of the pattern for the encapsulating layer (5).

In step B, after exposing and developing, the wafer (1,2,3), undercut, provided by the base layer (2), will be visible. At this stage, the undercut is kept to a minimum.

In step C, after hard baking, the photoresist (3) will reflow. It pulls back from the edge and takes on a rounded shape.

In step D, a second develop can be employed to re-create the undercut which will aid in the lift-off process of the first coating layer (4).

In step E, the wafer (1, 2, 3) is coated with a thin metal layer (4). The first metal layer (4) must be thinner than the base layer (2) to allow for clean lift-off and leave space for the developer to open up the pixel for the second coating (5).

In step F, the excess metal coating (4) is carefully lifted using a low-tack tape or other means of lift-off that do not dissolve the photoresist (3). This step may not be necessary due to resist (3) pull back during $2^{nd}$ hard bake.

In step G, the wafer (1, 2, 3) is developed again to remove some of the base layer (2), widening the pixel aperture.

In step H, baking the wafer (1, 2, 3) to reflow the photoresist (3) may need to be done at a higher temperature than the first hard bake.

In step I, after another develop (same process as step D), the undercut is reformed. Depending on the thickness of the second layer (5), this step may not be necessary.

In step J, the second coating, or encapsulating layer (5), goes down.

In step K, after the encapsulating layer (5), the wafer (1, 2, 3) can be lifted using conventional chemical methods.

Figure 4:
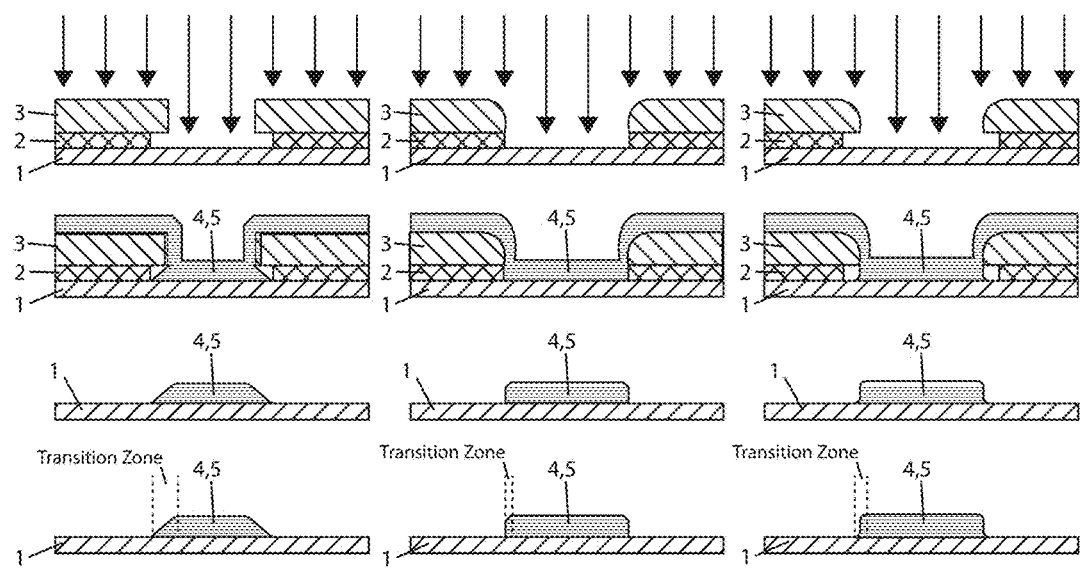

The advantages of this technique are that it can be performed using current processing methods, chemicals, and resists. In addition, the improvement in line of sight, due to the sloped profile of the lift-off resist pattern, has been found extremely beneficial in minimizing the transition zone (FIG. 4). This transition zone is a section of the thin film stack (4, 5) where its thickness is reduced by the shadow of the resist (3) and growing deposited film (4, 5). The lift-off profile must be optimized to provide the least hindrance to the arrival of the thin film material (4, 5) to the substrate. In the left most profile of FIG. 4, the standard dual layer patterning induced thin film profile shows a large transition zone. For optical applications, such a transition zone modifies the spectral performance of the film stack—mostly away from that predicted for a perfectly rectangular profile. The middle profile shows a smaller transition zone but the lift-off profile lacks ample undercut obstructing ease of liftoff. The right most profile shows an almost similar (albeit with a small foot) transition zone whilst retaining ample undercut for ease of liftoff.

Since certain changes may be made in the above described lithography process for dual deposition patterning without departing from the scope of the invention herein involved, it is intended that all matter contained in the description thereof or shown in the accompanying figures shall be interpreted as illustrative of the claims and not in a limiting sense.

What is claimed is:

1. A lithography method for dual deposition patterning comprising:

forming a wafer by coating a substrate with a non-photosensitive resist base layer and then adding a photoresist top layer over said non-photosensitive resist base layer;

then using a photomask to expose said photoresist top layer with a pattern of patterned pixel apertures;

then, using a first developer, developing said wafer until a first undercut in said non-photosensitive resist base layer results;

then conducting a first hard baking of said wafer until said photoresist top layer flows by pulling back from the edge of each of said patterned pixel apertures and curving down toward each of said patterned pixel apertures;

then, using a second developer, developing said wafer a second time until a second undercut in said non-photosensitive resist base layer results;

then coating said wafer with a first thin metal layer that is thinner than said non-photosensitive base resist layer;

then lifting off any first thin metal layer on said photoresist top layer using a low-tack lift-off that does not dissolve said photoresist top layer;

then, using a third developer, developing said wafer to remove some of the non-photosensitive base resist layer until a widening of said patterned pixel apertures results;

then conducting a second hard baking of said wafer a second time until said photoresist top layer flows by pulling back from the edge of each of said widened patterned pixel apertures and curving down toward each of said widened patterned pixel apertures;

then, using a fourth developer, developing said wafer until a third undercut in said non-photosensitive base resist layer forms;

then coating said wafer with an encapsulating layer; and, then lifting off said encapsulating layer over said photoresist top layer, said photoresist top layer, and said non-photosensitive resist base layer from said wafer using a conventional chemical lift-off means.

* * * * *